(12) United States Patent
Takei et al.

(10) Patent No.: US 6,674,301 B2
(45) Date of Patent: Jan. 6, 2004

(54) METHOD AND SYSTEM OF EVALUATING PLL BUILT-IN CIRCUIT

(75) Inventors: Akihiro Takei, Miyazaki (JP); Yuji Tanaka, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/319,686

(22) Filed: Dec. 16, 2002

(65) Prior Publication Data

US 2003/0222669 A1 Dec. 4, 2003

(30) Foreign Application Priority Data

Jun. 4, 2002 (JP) .......................... 2002-162614

(51) Int. Cl.[7] .............................................. G01R 31/26
(52) U.S. Cl. ..................... 324/765; 324/763; 324/158.1
(58) Field of Search ................................ 324/763, 765, 324/158.1, 76.53, 76.52, 76.77; 714/715, 716, 717

(56) References Cited

U.S. PATENT DOCUMENTS 4,754,216 A * 6/1988 Wong ..................... 324/76.82
5,555,278 A * 9/1996 Kondoh ..................... 375/376
5,973,571 A * 10/1999 Suzuki ......................... 331/17
6,294,935 B1 * 9/2001 Ott ............................. 327/150
6,378,098 B1 * 4/2002 Yamashita .................. 714/742

* cited by examiner

Primary Examiner—Kamand Cuneo
Assistant Examiner—Tung X. Nguyen
(74) Attorney, Agent, or Firm—Wenderoth, Lind & Ponack, L.L.P.

(57) ABSTRACT

A method of evaluating a PLL built-in circuit includes outputting an applied pattern signal from a test equipment synchronized with a system clock signal received by the test equipment, dividing the applied pattern signal into M/N frequencies by a frequency divider, wherein M and N are positive integers. The method further includes inputting the divided pattern signal into the PLL built-in circuit, inputting an output pattern signal outputted from the PLL built-in circuit into the test equipment and caring the output pattern signal with the applied pattern signal so as to evaluate the PLL built-in circuit. In the above method, M and N are set in a manner that a frequency of the output pattern signal from the PLL built-in circuit is substantially equal to a frequency of the system clock signal.

20 Claims, 4 Drawing Sheets

FIRST EMBODIMENT OF THE INVENTION

FIRST EMBODIMENT OF THE INVENTION

FIRST EMBODIMENT OF THE INVENTION

SECOND EMBODIMENT OF THE INVENTION

SECOND EMBODIMENT OF THE INVENTION

THIRD EMBODIMENT OF THE INVENTION

THIRD EMBODIMENT OF THE INVENTION (M=2)

THIRD EMBODIMENT OF THE INVENTION (M=3)

FOURTH EMBODIMENT OF THE INVENTION

FOURTH EMBODIMENT OF THE INVENTION (M=2)

METHOD AND SYSTEM OF EVALUATING PLL BUILT-IN CIRCUIT

BACKGROUND OF THE INVENTION

The present invention relates to a PLL (Phase Locked Loop) built-in semiconductor integrated circuit (hereinafter, referred to as PLL built-in circuit), specifically to an evaluation method of a PLL built-in circuit, an evaluation system of a PLL built-in circuit, and a PLL built-in circuit containing a frequency divider.

Conventional test equipment stores a test pattern formed by combining an applied pattern outputted during a test and an expected pattern being an output of a normal tested device corresponding to the applied pattern in a memory. The test equipment operates on the basis of a system clock of a predetermined frequency. Generally, the PLL built-in circuit includes a PLL circuit and an F/F (Flip-Flop) circuit.

During a test, the test equipment inputs the applied pattern to the PLL built-in circuit synchronously with the system clock. Since the PLL circuit of the PLL built-in circuit operates at the speed of N times the system clock frequency, the output pattern of the PLL circuit switches at the frequency of N times the frequency of the applied pattern, and the output pattern of the F/F circuit (the output pattern of the PLL built-in circuit) also switches at the frequency of N times the frequency of the applied pattern. Receiving the output pattern from the PLL built-in circuit, the test equipment cares the output pattern with the expected pattern provided in advance, and thereby evaluates the PLL built-in circuit.

The first conventional evaluation method cares the output pattern with the expected pattern, at a timing of one time in one phase of the applied pattern outputted from the test equipment.

The second conventional evaluation method cares the output pattern with the expected pattern, at a timing of four times in one phase of the applied pattern outputted from the test equipment.

However, in the first conventional evaluation method, although the output pattern changes four times in one phase of the applied pattern, the care is executed only one time in one phase, which means that only one-fourth the number of the output pattern is cared; accordingly, the evaluation result involves a low reliability. And, the first conventional evaluation method executes the care only for one-fourth the number of the output pattern, and the evaluation of speed and access time of the PLL built-in circuit is impossible accordingly.

In the second conventional evaluation method, the care is executed four times in one phase of the applied pattern, but the number of the test pattern (combination of the applied pattern and the expected pattern) becomes four times the number with the case of the first conventional evaluation method, and in consequence the testing time becomes N times.

SUMMARY OF THE INVENTION

The invention may provide an evaluation method of a PLL built-in circuit, an evaluation system of a PLL built-in circuit, and a PLL built-in circuit that allow various characteristic evaluations without increasing test patterns with high reliability of the evaluation results.

A method of evaluating a PLL built-in circuit according the present invention includes outputting an applied pattern signal from a test equipment synchronized with a system clock signal received by the test equipment, dividing the applied pattern signal into M/N frequencies by a frequency divider, wherein M and N are positive integers. The method further includes inputting the divided pattern signal into the PLL built-in circuit, inputting an output pattern signal outputted from the PLL built-in circuit into the test equipment and caring the output pattern signal with the applied pattern signal so as to evaluate the PLL built-in circuit. In the method according to the present invention, M and N are set in a manner that a frequency of the output pattern signal from the PLL built-in circuit is substantially equal to a frequency of the system clock signal.

DETAILED DESCRIPTION OF THE PREFERRED EMBODIMENTS

Figure 1:
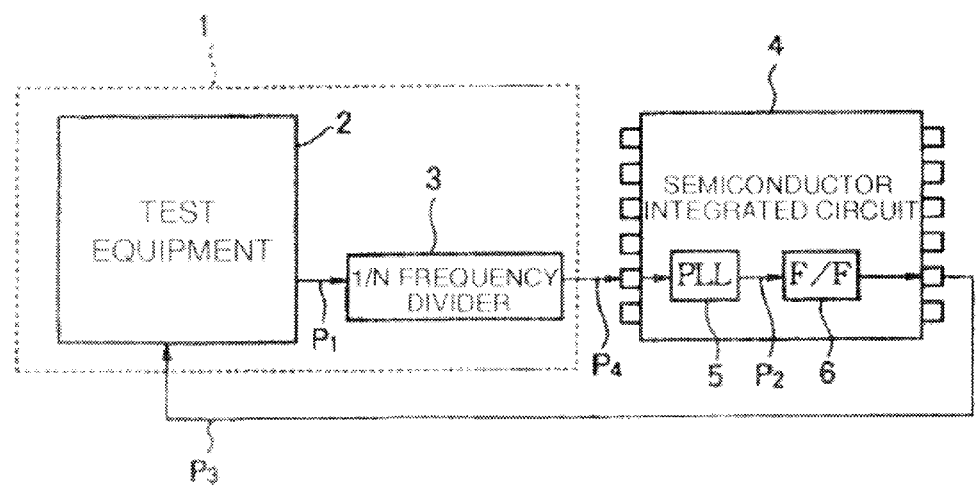
FIG. 1 is a block diagram that explains an evaluation method (or an evaluation system to implement this evaluation method) of a PLL built-in circuit relating to the first embodiment of the present invention.
Figure 2:
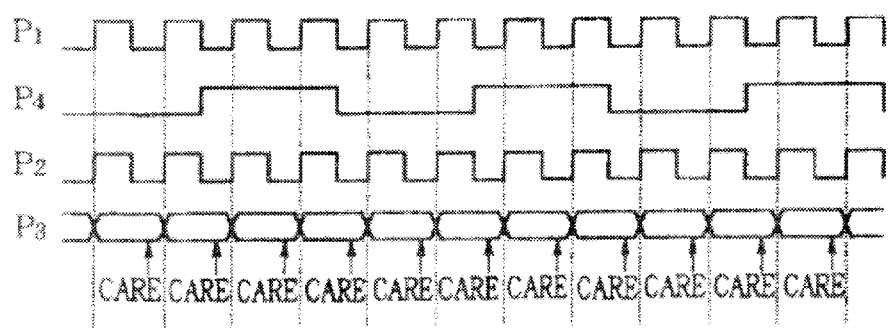
FIG. 2 is a time chart that explains the evaluation method of a PLL built-in circuit relating to the first embodiment.

FIG. 1 is a block diagram that explains an evaluation method (or an evaluation system to implement this evaluation method) of a PLL built-in semiconductor integrated circuit (hereunder, referred to as PLL built-in circuit) 4 relating to the first embodiment of the invention. FIG. 2 is a time chart that explains the evaluation method of the PLL built-in circuit 4 relating to the first embodiment.

The evaluation method of the PLL built-in circuit 4 relating to the first embodiment is carried out by an evaluation system 1 illustrated in FIG. 1. The evaluation system 1 includes test equipment 2 and a 1/N-frequency divider 3.

The test equipment 2 holds in a memory a test pattern formed by combining an applied pattern $P_1$ outputted during the test and an expected pattern being the output of a normal tested device corresponding to the applied pattern $P_1$. The test equipment 2 operates on the basis of the system clock of a predetermined frequency.

The 1/N frequency divider 3 divides the frequency of the applied pattern $P_1$ outputted from the test equipment 2 synchronously with the system clock into. 1/N (N: positive integer) to generate an applied pattern $P_4$, which is inputted to the PLL built-in circuit 4 being the tested device. Here, the value of N is set in such a manner that the frequency of an output pattern $P_3$ outputted from the PLL built-in circuit 4 becomes equal to the frequency of the system clock of the test equipment 2.

The PLL built-in circuit 4 includes a PLL (Phase Locked Loop) circuit 5 and an F/F (Flip-Flop) circuit 6. The PLL circuit 5 outputs a signal $P_2$ whose frequency is N times the frequency of the applied pattern $P_4$. The F/F circuit 6 outputs the output pattern $P_3$ having the same frequency as that of the signal $P_2$ outputted from the PLL circuit 5. In the first embodiment, N is equal to 4. However, N can take on an integer other than 4 (for example, any of 2, 3, 5, 6, . . . ).

During the test, the test equipment 2 outputs the applied pattern $P_1$ synchronously with the system clock; the 1/N frequency divider 3 divides the frequency of the applied pattern $P_1$ into 1/N to generate the applied pattern $P_4$, which is inputted to the PLL built-in circuit 4. The PLL circuit 5 of the PLL built-in circuit 4 operates at N times the speed of the system clock frequency to output the pattern $P_2$, and the output pattern $P_3$ from the F/F circuit 6 is inputted to the test equipment 2. The output pattern $P_3$ switches at the same frequency as that of the applied pattern $P_1$. Receiving the output pattern $P_3$ from the PLL built-in circuit 4, the test equipment 2 cares the output pattern $P_3$ with the expected pattern provided in advance at the timing illustrated by CARE in FIG. 2, and thereby evaluates the PLL built-in circuit 4.

As described above, according to the evaluation method or the evaluation system relating to the first embodiment, the frequency of the applied pattern $P_1$ is divided into 1/N to generate the applied pattern $P_4$, which is applied to the PLL built-in circuit 4, and the frequency of the output pattern $P_3$ from the PLL built-in circuit 4 is brought in coincidence with the frequency of the system clock of the test equipment 2; accordingly, if the test equipment 2 executes an evaluation synchronously with the system clock, the evaluation (CARE in FIG. 2) will become possible at each period of the output pattern $P_3$ from the PLL built-in circuit 4. Consequently, in comparison to the conventional evaluation system (refer to FIG. 11) that executes only one evaluation to the plural periods of the output pattern $P_3$ from the PLL built-in circuit, the evaluation system of this embodiment achieves a higher reliability of the evaluation result of the PLL built-in circuit 4.

According to the evaluation method or the evaluation system relating to the first embodiment, the frequency of the applied pattern $P_1$ is divided into 1/N, which is applied to the PLL built-in circuit 4, and the frequency of the output pattern $P_3$ from the PLL built-in circuit 4 is brought in coincidence with the frequency of the system clock of the test equipment 2; accordingly, the number of the test pattern formed by combining the applied pattern $P_1$ and the expected pattern being the output pattern of a normal tested device corresponding to the applied pattern $P_1$ can be reduced to 1/N in comparison to the conventional system in FIG. 12, and the testing time can be shortened. Also, the reduction in the number of the test pattern will simplify the description of the test pattern, which facilitates various evaluations including a speed evaluation and access time evaluation.

Figure 3:
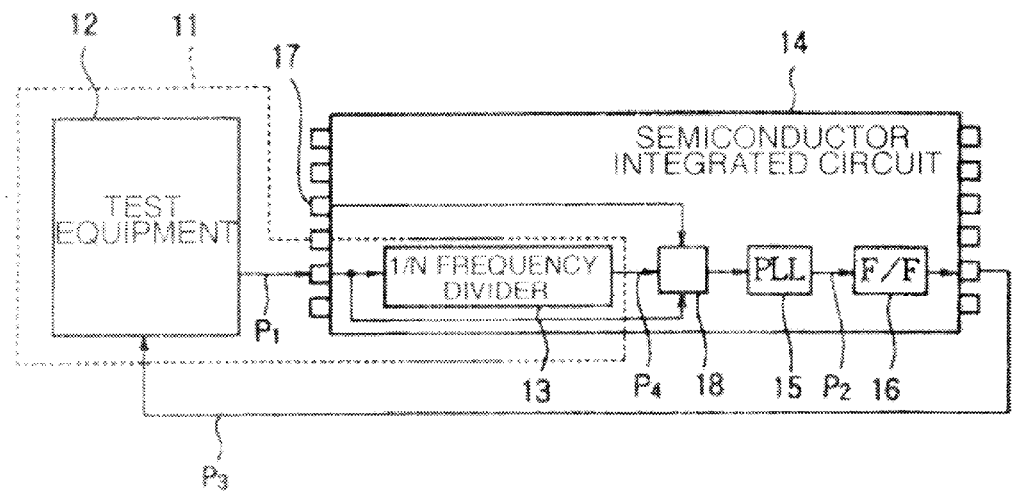
FIG. 3 is a block diagram that explains an evaluation method (or an evaluation system to implement this evaluation method) of a PLL built-in circuit relating to the second embodiment of the invention.
Figure 4:
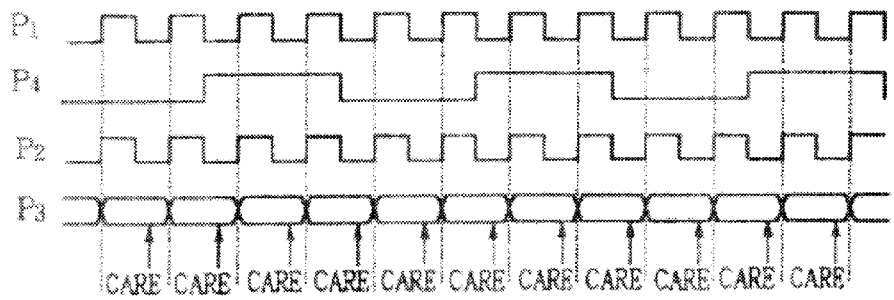
FIG. 4 is a time chart that explains the evaluation method of a PLL built-in circuit relating to the second embodiment.

FIG. 3 is a block diagram that explains an evaluation method of a PLL built-in circuit 14 (or an evaluation system to implement this evaluation method or a PLL built-in circuit to enable this evaluation method) relating to the second embodiment of the invention. FIG. 4 is a time chart that explains the evaluation method of the PLL built-in circuit 14 relating to the second embodiment.

The evaluation method of the PLL built-in circuit 14 relating to the second embodiment is carried out by an evaluation system 11 illustrated in FIG. 3. The evaluation system 11 includes test equipment 12 and a 1/N-frequency divider 13 incorporated in the PLL built-in circuit 14.

The test equipment 12 holds in a memory a test pattern formed by combining an applied pattern $P_1$ outputted during the test and an expected pattern being the output of a normal tested device corresponding to the applied pattern $P_1$. The test equipment 12 operates on the basis of the system clock of a predetermined frequency.

The 1/N frequency divider 13 incorporated in the PLL built-in circuit 14 divides the frequency of the applied pattern $P_1$ outputted from the test equipment 12 synchronously with the system clock into 1/N (N:positive integer) to generate an applied pattern $P_4$, which is inputted to a PLL circuit 15. Here, the value of N is set in such a manner that the frequency of an output pattern $P_3$ outputted from the PLL built-in circuit 14 becomes equal to the frequency of the system clock of the test equipment 12.

The PLL built-in circuit 14 includes the PLL circuit 15, an F/F circuit 16, and an input line selecting circuit 18. The input line selecting circuit 18 switches the output signal (namely, the input signal to the PLL circuit 15) into a signal having passed through the 1/N frequency divider 13 during the test, or a signal having bypassed the 1/N frequency divider 13 during the normal operation. The input line selecting circuit 18 switches the signal inputted to the PLL circuit 15 according to a selection signal inputted to a terminal 17. The PLL circuit 15 outputs a signal that the frequency of the input signal thereto is multiplied by N. The F/F circuit 16 outputs the output pattern $P_3$ having the same frequency as that of the signal $P_2$ outputted from the PLL circuit 15. In the second embodiment, N is equal to 4. However, N can take on an integer other than 4 (for example, any of 2, 3, 5, 6, . . . ).

During the test, the test equipment 12 outputs the applied pattern $P_1$ synchronously with the system clock; the 1/N frequency divider 13 incorporated in the PLL built-in circuit 14 divides the frequency of the applied pattern $P_1$ into 1/N to generate the applied pattern $P_4$, which is inputted to the PLL circuit 15. The PLL circuit 15 operates at N times the speed of the system clock frequency to output the pattern $P_2$ and the output pattern $P_3$ from the F/F circuit 16 is inputted to the test equipment 12. The output pattern $P_3$ switches at the same frequency as that of the applied pattern $P_1$. Receiving the output pattern $P_3$ from the PLL built-in circuit 14, the test equipment 12 cares the output pattern $P_3$ with the expected pattern provided in advance at the timing illustrated by CARE in FIG. 4, and there by evaluates the PLL built-in circuit 14.

As described above, according to the evaluation method, the evaluation system, or the PLL built-in circuit relating to the second embodiment, the frequency of the applied pattern $P_1$ is divided into 1/N to generate the applied pattern $P_4$, which is applied to the PLL circuit 15, and the frequency of the output pattern $P_3$ from the PLL built-in circuit 14 is brought in coincidence with the frequency of the system clock of the test equipment 12; accordingly, if the test equipment 12 executes an evaluation synchronously with the system clock, the evaluation (CARE in FIG. 4) will become possible at each period of the output pattern $P_3$ from the PLL built-in circuit 14. Consequently, in comparison to the conventional evaluation system (FIG. 11) that executes only one evaluation to the plural periods of the output pattern $P_3$ from the PLL built-in circuit, the evaluation system of this embodiment achieves a higher reliability of the evaluation result of the PLL built-in circuit 14.

According to the evaluation method, the evaluation system, or the PLL built-in circuit relating to the second embodiment, the frequency of the applied pattern $P_1$ is divided into 1/N, which is applied to the PLL circuit 15, and the frequency of the output pattern $P_3$ from the PLL built-in circuit 14 is brought in coincidence with the frequency of the system clock of the test equipment 12; accordingly, the number of the test pattern formed by combining the applied pattern $P_1$ and the expected pattern being the output pattern of a normal tested device corresponding to the applied pattern $P_1$ can be reduced to 1/N in comparison to the conventional method in FIG. 12, and the testing time can be shortened. Also, the reduction in the number of the test pattern will simplify the description of the test pattern, which facilitates various evaluations including a speed evaluation and access time evaluation.

According to the evaluation method, the evaluation system, or the PLL built-in circuit relating to the second embodiment, the PLL built-in circuit 14 incorporates the frequency divider 13, which makes it possible to enhance the reliability of the evaluation result and to shorten the testing time of the PLL built-in circuit without changing the conventional testing environments (test equipment 42 in FIG. 10), and to facilitate various evaluations including a speed evaluation and access time evaluation.

Figure 5:
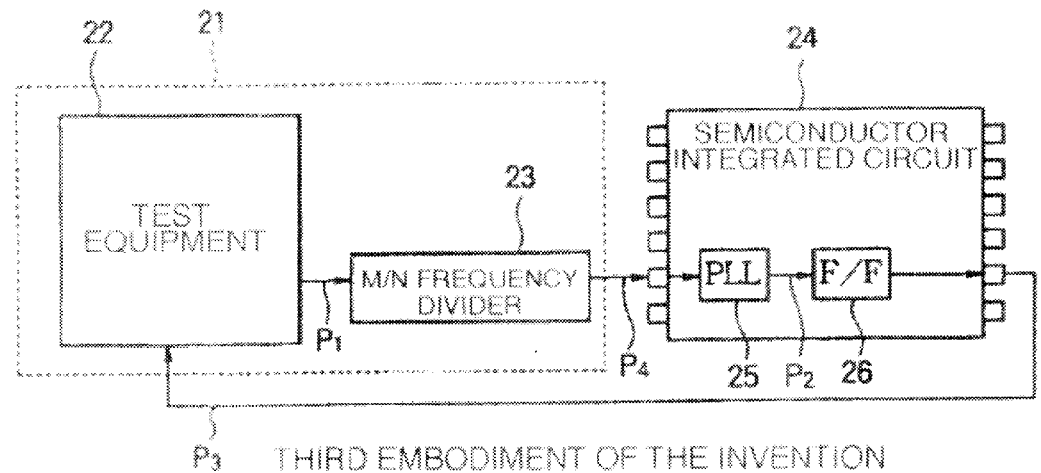
FIG. 5 is a block diagram that explains an evaluation method (or an evaluation system to implement this evaluation method) of a PLL built-in circuit relating to the third embodiment of the invention.
Figure 6:
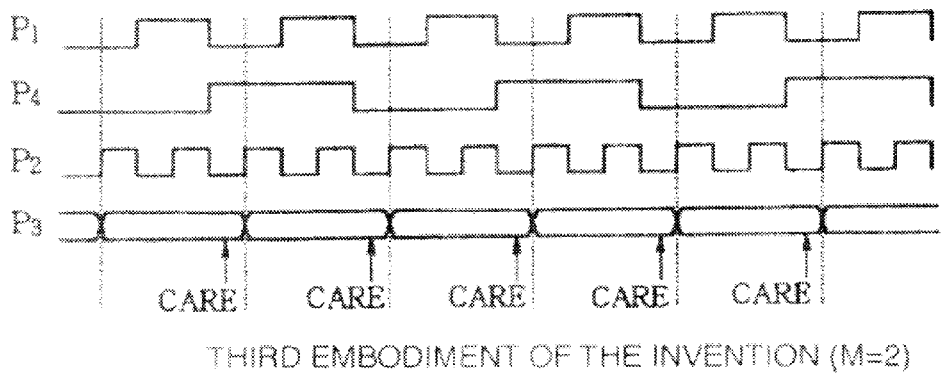
FIG. 6 is a time chart that explains the evaluation method of a PLL built-in circuit relating to the third embodiment.
Figure 7:
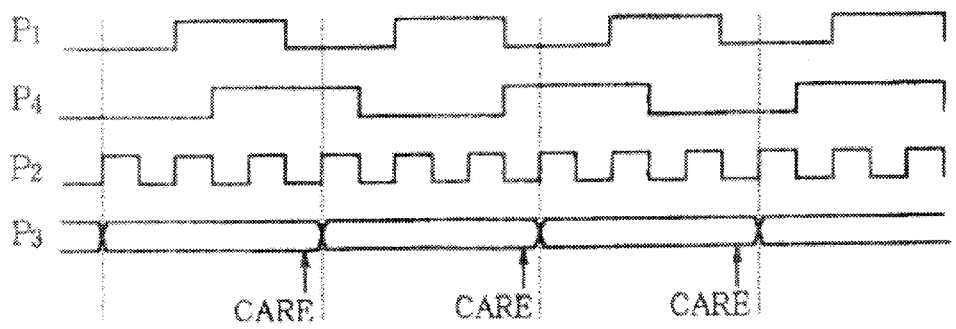
FIG. 7 is a time chart that explains another example of the evaluation method of a PLL built-in circuit relating to the third embodiment.

FIG. 5 is a block diagram that explains an evaluation method of a PLL built-in circuit 24 (or an evaluation system to implement this evaluation method) relating to the third embodiment of the invention. FIG. 6 is a time chart that explains the evaluation method of the PLL built-in circuit 24 relating to the third embodiment, and FIG. 7 is a time chart that explains another example of the evaluation method of the PLL built-in circuit 24 relating to the third embodiment.

The evaluation method of the PLL built-in circuit 24 relating to the third embodiment is carried out by an evaluation system 21 illustrated in FIG. 5. The evaluation system 21 includes test equipment 22 and an M/N frequency divider 23.

The test equipment 22 holds in a memory a test pattern formed by combining an applied pattern $P_1$ outputted during the test and an expected pattern being the output of a normal tested device corresponding to the applied pattern $P_1$. The test equipment 22 operates on the basis of the system clock of a predetermined frequency.

The M/N frequency divider 23 divides the frequency of an applied pattern $P_1$ outputted from the test equipment 22 synchronously with the system clock into M/N (M, N: positive integer) to generate an applied pattern $P_4$, which is inputted to the PLL built-in circuit 24 being a tested device. Here, the values of M and N are set in such a manner that the frequency of an output pattern $P_3$ outputted from the PLL built-in circuit 24 becomes equal to the frequency of the system clock of the test equipment 22.

The PLL built-in circuit 24 includes a PLL circuit 25 and an F/F circuit 26. The PLL circuit 25 outputs a signal $P_2$ whose frequency is N times the frequency of the applied pattern $P_4$. The F/F circuit 26 operates at a 1/M frequency of the clock generated by the PLL circuit 25. In FIG. 6, M, N are equal to 2, 4, respectively. In FIG. 7, M, N are equal to 3, 4, respectively. However, M and N are able to take on the other integers.

During the test, the test equipment 22 outputs the applied pattern $P_1$ synchronously with the system clock; the M/N frequency divider 23 divides the frequency of the applied pattern $P_1$ into M/N to generate the applied pattern $P_4$, which is inputted to the PLL built-in circuit 24. The PLL circuit 25 of the PLL built-in circuit 24 operates at N times the speed of the system clock frequency to output the pattern $P_2$, and the frequency of the pattern $P_2$ is divided into 1/M by the F/F circuit 26 to generate the output pattern $P_3$, which is inputted to the test equipment 22. The output pattern $P_3$ switches at the same frequency as that of the applied pattern $P_1$. Receiving the output pattern $P_3$ from the PLL built-in circuit 24, the test equipment 22 cares the output pattern $P_3$ with the expected pattern provided in advance at the timing illustrated by CARE in FIG. 6, or at the timing illustrated by CARE in FIG. 7, and thereby evaluates the PLL built-in circuit 24.

As described above, according to the evaluation method or the evaluation system relating to the third embodiment, the frequency of the applied pattern $P_1$ is divided into M/N to generate the applied pattern $P_4$ which is applied to the PLL built-in circuit 24, and the frequency of the output pattern $P_3$ from the PLL built-in circuit 24 is brought in coincidence with the frequency of the system clock of the test equipment 22; accordingly, if the test equipment 22 executes an evaluation synchronously with the system clock, the evaluation (CARE in FIG. 6 or FIG. 7) will become possible at each period of the output pattern $P_3$ from the PLL built-in circuit 24. Consequently, in comparison to the conventional evaluation system (FIG. 11) that executes only one evaluation to the plural periods of the output pattern $P_3$ from the PLL built-in circuit, the evaluation system of this embodiment achieves a higher reliability of the evaluation result of the PLL built-in circuit 24.

According to the evaluation method or the evaluation system relating to the third embodiment, the frequency of the applied pattern $P_1$ is divided into M/N, which is applied to the PLL built-in circuit 24, and the frequency of the output pattern $P_3$ from the PLL built-in circuit 24 is brought in coincidence with the frequency of the system clock of the test equipment 22; accordingly, the number of the test pattern formed by combining the applied pattern $P_1$ and the expected pattern being the output pattern of a normal tested device corresponding to the applied pattern $P_1$ can be reduced to 1/N in comparison to the conventional method in FIG. 12, and the testing time can be shortened. Also, the reduction in the number of the test pattern will simplify the description of the test pattern, which facilitates various evaluations including a speed evaluation and access time evaluation.

Figure 8:
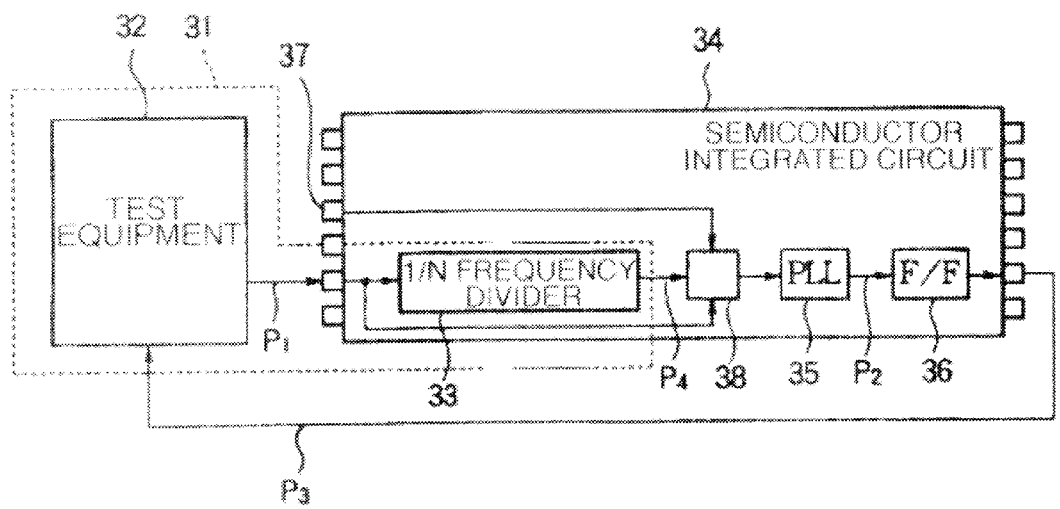
FIG. 8 is a block diagram that explains an evaluation method (or an evaluation system to implement this evaluation method) of a PLL built-in circuit relating to the fourth embodiment of the invention.
Figure 9:
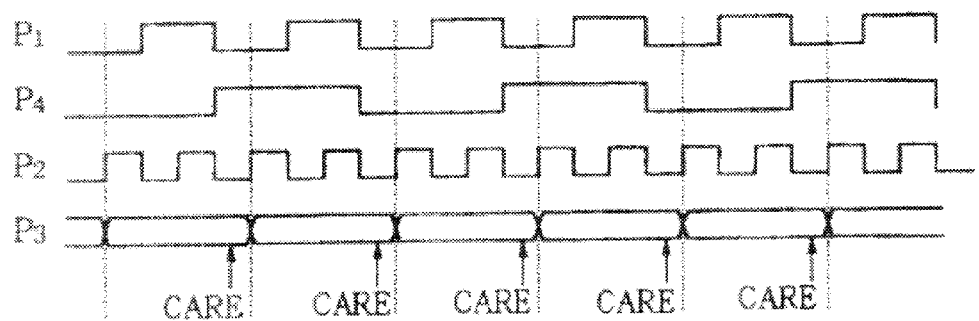
FIG. 9 is a time chart that explains the evaluation method of a PLL built-in circuit relating to the fourth embodiment.

FIG. 8 is a block diagram that explains an evaluation method of a PLL built-in circuit 34 (or an evaluation system to implement this evaluation method or a PLL built-in circuit to enable this evaluation method) relating to the fourth embodiment of the invention. FIG. 9 is a time chart that explains the evaluation method of the PLL built-in circuit 34 relating to the second embodiment.

The evaluation method of the PLL built-in circuit 34 relating to the fourth embodiment is carried out by an evaluation system 31 illustrated in FIG. 8. The evaluation system 31 includes test equipment 32 and an M/N frequency divider 33 incorporated in the PLL built-in circuit 34.

The test equipment 32 holds in a memory a test pattern formed by combining an applied pattern $P_1$ outputted during the test and an expected pattern being the output of a normal tested device corresponding to the applied pattern $P_1$. The test equipment 32 operates on the basis of the system clock of a predetermined frequency.

The M/N frequency divider 33 incorporated in the PLL built-in circuit 34 divides the frequency of the applied pattern $P_1$ outputted from the test equipment 32 synchronously with the system clock into M/N (M, N: positive integer) to generate an applied pattern $P_4$, which is inputted to a PLL circuit 35. Here, the value of M and N are set in such a manner that the frequency of an output pattern $P_3$ outputted from the PLL built-in circuit 34 becomes equal to the frequency of the system clock of the test equipment 32.

The PLL built-in circuit 34 includes the PLL circuit 35, an F/F circuit 36, and an input line selecting circuit 38. The input line selecting circuit 38 switches the output signal (namely, the input signal to the PLL circuit 35) into a signal having passed through the M/N frequency divider 33 during the test, or a signal having bypassed the M/N frequency divider 33 during the normal operation. The input line selecting circuit 38 switches the signal inputted to the PLL circuit 35 according to a selection signal inputted to a terminal 37. The PLL circuit 35 outputs a signal that the frequency of the input signal thereto is multiplied by N. The F/F circuit 36 operates at a 1/M frequency of the clock generated by the PLL circuit 35. In FIG. 9, M, N are equal to 2, 4, respectively. However, M and N can take on the other integers.

During the test, the test equipment 32 outputs the applied pattern $P_1$ synchronously with the system clock; the M/N frequency divider 33 incorporated in the PLL built-in circuit 34 divides the frequency of the applied pattern $P_1$ into M/N to generate the applied pattern $P_4$, which is inputted to the PLL circuit 35. The PLL circuit 35 operates at N times the speed of the system clock frequency to output the pattern $P_2$ and the output pattern $P_3$ from the F/F circuit 36 is inputted to the test equipment 32. The output pattern $P_3$ switches at the same frequency as that of the applied pattern $P_1$. Receiving the output pattern $P_3$ from the PLL built-in circuit 34, the test equipment 32 cares the output pattern $P_3$ with the expected pattern provided in advance, and thereby evaluates the PLL built-in circuit 34.

As described above, according to the evaluation method, the evaluation system, or the PLL built-in circuit relating to the fourth embodiment, the frequency of the applied pattern $P_1$ is divided into M/N to generate the applied pattern $P_4$ which is applied to the PLL circuit 35, and the frequency of the output pattern $P_3$ from the PLL built-in circuit 34 is brought in coincidence with the frequency of the system clock of the test equipment 32; accordingly, if the test equipment 32 executes an evaluation synchronously with the system clock, the evaluation (CARE in FIG. 9) will become possible at each period of the output pattern $P_3$ from the PLL built-in circuit 34. Consequently, in comparison to the conventional evaluation system (FIG. 11) that executes only one evaluation to the plural periods of the output pattern $P_3$ from the PLL built-in circuit, the evaluation system of this embodiment achieves a higher reliability of the evaluation result of the PLL built-in circuit 34.

According to the evaluation method, the evaluation system, or the PLL built-in circuit relating to the fourth embodiment, the frequency of the applied pattern $P_1$ is divided into M/N, which is applied to the PLL circuit 35, and the frequency of the output pattern $P_3$ from the PLL built-in circuit 34 is brought in coincidence with the frequency of the system clock of the test equipment 32; accordingly, the number of the test pattern formed by combining the applied pattern $P_1$ and the expected pattern being the output pattern of a normal tested device corresponding to the applied pattern $P_1$ can be reduced to 1/N in comparison to the conventional method in FIG. 12, and the testing time can be shortened. Also, the reduction in the number of the test pattern will simplify the description of the test pattern, which facilitates various evaluations including a speed evaluation and access time evaluation.

According to the evaluation method, the evaluation system, or the PLL built-in circuit relating to the fourth embodiment, the PLL built-in circuit 34 incorporates the frequency divider 33, which makes it possible to enhance the reliability of the evaluation result and to shorten the testing time of the PLL built-in circuit without changing the conventional testing environments (test equipment 42 in FIG. 10), and to facilitate various evaluations including a speed evaluation and access time evaluation.

As the embodiments thus described, according to the evaluation method of the PLL built-in circuit set forth in claim 1, or the evaluation system of the PLL built-in circuit set forth in claim 3, the frequency of the applied pattern is divided into M/N, which is applied to the PLL built-in circuit, and the frequency of the output pattern from the PLL built-in circuit is brought in coincidence with the frequency of the system clock of the test equipment; therefore, if the test equipment executes an evaluation synchronously with the system clock, the evaluation will become possible at each period of the output pattern from the PLL built-in circuit. Consequently, in comparison to the conventional evaluation system (FIG. 11) that executes only one evaluation to the plural periods of the output pattern from the PLL built-in circuit, the evaluation method or the evaluation system of the invention is able to enhance the reliability of the evaluation result of the PLL built-in circuit.

According to the evaluation method of the PLL built-in circuit set forth in claim 1, or the evaluation system of the PLL built-in circuit set forth in claim 3, the frequency of the applied pattern is divided into M/N, which is applied to the PLL built-in circuit, and the frequency of the output pattern from the PLL built-in circuit is brought in coincidence with the frequency of the system clock of the test equipment; therefore, the number of the test pattern formed by combining the applied pattern and the expected pattern being the output pattern of a normal tested device corresponding to the applied pattern can be reduced to 1/N in comparison to the conventional system in FIG. 12, and the testing time can be shortened. Also, the reduction in the number of the test pattern will simplify the description of the test-pattern, which facilitates various evaluations including a speed evaluation and access time evaluation.

According to the evaluation method of the PLL built-in circuit set forth in claim 2, or the evaluation system of the PLL built-in circuit set forth in claim 4, the frequency of the applied pattern is divided into M/N by the frequency divider incorporated in the PLL built-in circuit, which is applied to the PLL built-in circuit, and the frequency of the output pattern from the PLL built-in circuit is brought in coincidence with the frequency of the system clock of the test equipment; therefore, if the test equipment executes an evaluation synchronously with the system clock, the evaluation will become possible at each period of the output pattern from the PLL built-in circuit. Consequently, in comparison to the conventional evaluation system in FIG. 11 that executes only one evaluation to the plural periods of the output pattern from the PLL built-in circuit, the evaluation method or the evaluation system of the invention is able to enhance the reliability of the evaluation result of the PLL built-in circuit.

According to the evaluation method of the PLL built-in circuit set forth in claim 2, or the evaluation system of the PLL built-in circuit set forth in claim 4, the frequency of the applied pattern is divided into M/N by the frequency divider incorporated in the PLL built-in circuit, which is applied to the PLL built-in circuit, and the frequency of the output pattern from the PLL built-in circuit is brought in coincidence with the frequency of the system clock of the test equipment; therefore, the number of the test pattern formed by combining the applied pattern and the expected pattern being the output pattern of a normal tested device corresponding to the applied pattern can be reduced to 1/N in comparison to the conventional system in FIG. 12, and the testing time can be shortened. Also, the reduction in the number of the test pattern will simplify the description of the test pattern, which facilitates various evaluations including a speed evaluation and access time evaluation.

According to the PLL built-in circuit set forth in claim 5, the frequency of the applied pattern is divided into M/N by the frequency divider incorporated in the PLL built-in circuit, which is applied to the PLL built-in circuit, and the frequency of the output pattern from the PLL built-in circuit can be brought in coincidence with the frequency of the system clock of the test equipment; therefore, if the test equipment executes an evaluation synchronously with the system clock, the evaluation will become possible at each period of the output pattern from the PLL built-in circuit. Consequently, in comparison to the conventional evaluation system (FIG. 11) that executes only one evaluation to the plural periods of the output pattern from the PLL built-in circuit, the PLL built-in circuit of the invention is able to enhance the reliability of the evaluation result.

According to the PLL built-in circuit set forth in claim 5, the frequency of the applied pattern is divided into M/N by the frequency divider incorporated in the PLL built-in circuit, which is applied to the PLL built-in circuit, and the frequency of the output pattern from the PLL built-in circuit can be brought in coincidence with the frequency of the system clock of the test equipment; therefore, the number of the test pattern formed by combining the applied pattern and the expected pattern being the output pattern of a normal tested device corresponding to the applied pattern can be reduced to 1/N in comparison to the conventional system in FIG. 12, and the testing time can be shortened. Also, the reduction in the number of the test pattern will simplify the description of the test pattern, which facilitates various evaluations including a speed evaluation and access time evaluation.

According to the evaluation method of the PLL built-in circuit set forth in claim 2, the evaluation system of the PLL built-in circuit set forth in claim 4, or the PLL built-in circuit set forth in claim 5, the PLL built-in circuit incorporates the frequency divider, which achieves enhancing the reliability of the evaluation result and shortening the testing time of the PLL built-in circuit without changing the conventional testing environments (test equipment 42 in FIG. 10), and also facilitating various evaluations including a speed evaluation and access time evaluation.

What is claimed is:

1. A method of evaluating a PLL built-in circuit comprising:

outputting an applied pattern signal from a test equipment synchronized with a system clock signal received by the test equipment;

dividing the applied pattern signal into M/N frequencies by a frequency divider, wherein M and N are positive integers;

inputting the divided pattern signal into the PLL built-in circuit;

inputting an output pattern signal outputted from the PLL built-in circuit into the test equipment; and caring the output pattern signal with the applied pattern signal so as to evaluate the PLL built-in circuit, wherein M and N are set in a manner that a frequency of the output pattern signal from the PLL built-in circuit is substantially equal to a frequency of the system clock signal.

2. A method of evaluating a PLL built-in circuit according to claim 1, wherein the test equipment and the frequency divider constitute an evaluation system.

3. A method of evaluating a PLL built-in circuit according to claim 1, wherein the PLL built-in circuit includes a PLL circuit and a flip-flop.

4. A method of evaluating a PLL built-in circuit according to claim 3, wherein the PLL built-in circuit further includes the frequency divider.

5. A method of evaluating a PLL built-in circuit according to claim 1, wherein the M equals to 1.

6. A method of evaluating a semiconductor device including a PLL circuit, comprising:

providing a test pattern signal from a test equipment, the test signal being synchronized with a system clock signal received by the test equipment;

dividing the test signal into M/N frequencies by a frequency divider, wherein M and N are positive integers;

inputting the divided test signal into the PLL circuit, the PLL circuit outputting an output pattern signal;

inputting the output pattern signal into the test equipment; and caring the output pattern signal with the test signal so as to evaluate the semiconductor device, wherein M and N are set in a manner that a frequency of the output pattern signal is substantially equal to a frequency of the system clock signal.

7. A method of evaluating a semiconductor device according to claim 6, wherein the test equipment and the frequency divider constitute an evaluation system.

8. A method of evaluating a semiconductor device according to claim 6, wherein the semiconductor device includes a flip-flop.

9. A method of evaluating a semiconductor device according to claim 8, wherein the semiconductor device further includes the frequency divider.

10. A method of evaluating a semiconductor device according to claim 6, wherein the M equals to 1.

11. An evaluation system comprising:

a test equipment for generating a test pattern signal synchronized with a system clock signal received thereto;

a frequency divider coupled to the test equipment, the frequency divider dividing the test pattern signal received thereto with M/N frequencies and outputting the divided test signal; and a PLL circuit coupled to the frequency divider for receiving the divided test signal and outputting an output pattern signal having a frequency being N times a frequency of the signal received thereto, wherein the test equipment cares the output pattern signal with the test signal so as to evaluate the PLL circuit.

12. An evaluation system according to claim 11, wherein the PLL circuit is formed in a semiconductor device.

13. An evaluation system according to claim 12, wherein the semiconductor device includes a flip-flop, and wherein the flip-flop receives the output pattern signal from the PLL circuit and outputs a signal having the same frequency with that of the output pattern signal to the test equipment.

14. An evaluation system according to claim 11, wherein the semiconductor device includes the frequency divider.

15. An evaluation system according to claim 11, wherein the test equipment and the frequency divider constitute an evaluation equipment.

16. An evaluation system according to claim 11, wherein the M equals to 1.

17. An evaluation system according to claim 11, wherein the M equals to 2.

18. An evaluation system according to claim 11, wherein the M equals to 3.

19. An evaluation system according to claim 11, further comprising an input selection circuit coupled between the frequency divider and the PLL circuit, and wherein the input selection circuit selects the test signal and the divided test signal and outputting the selected signal to the PLL circuit.

20. An evaluation system according to claim 19, wherein the selection signal selects the signal in response to a signal received from outside.

* * * * *